(12) United States Patent
Kim (10) Patent No.: US 7,163,865 B2
(45) Date of Patent: Jan. 16, 2007

(54) METHOD OF FORMING TRANSISTOR HAVING RECESS CHANNEL IN SEMICONDUCTOR MEMORY, AND STRUCTURE THEREOF

(75) Inventor: Ji-Young Kim, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 129 days.

(21) Appl. No.: 10/867,845

(22) Filed: Jun. 14, 2004

(65) Prior Publication Data

US 2004/0259311 A1    Dec. 23, 2004

(30) Foreign Application Priority Data

Jun. 17, 2003    (KR) .................... 10-2003-0039164

(51) Int. Cl.
*H01L 21/336* (2006.01)

(52) U.S. Cl. ............... 438/270; 438/589; 257/E21.429
(58) Field of Classification Search ............... 438/259, 438/270, 589, 739
See application file for complete search history.

(56) References Cited

U.S. PATENT DOCUMENTS

| 4,857,477 | A | * | 8/1989 | Kanamori | .................... 438/386 |
| 5,674,775 | A |  | 10/1997 | Ho et al. | |
| 5,817,558 | A |  | 10/1998 | Wu | |
| 6,103,635 | A | * | 8/2000 | Chau et al. | .................. 438/739 |
| 2002/0197780 | A1 |  | 12/2002 | Lai et al. | |

* cited by examiner

*Primary Examiner*—Chandra Chaudhari
(74) *Attorney, Agent, or Firm*—Marger Johnson & McCollom, P.C.

(57) ABSTRACT

Embodiments of the invention include sequentially forming a pad oxide film and a mask film on a semiconductor substrate, and then forming an opening for partially exposing the pad oxide film. An undercut region is formed using the mask film as an etch mask, exposing a partial surface of the substrate. A spacer is formed surrounding both sidewalls of the mask film, and a recess is formed in the substrate. A gate oxide film, a gate electrode, a gate insulation film, a gate spacer, and source and drain regions are also formed. A resultant transistor structure has a small open critical dimension that improves process margin and provides uniformity to the recess depth, and removes a requirement that a bottom critical dimension of a subsequently formed self-aligned contact should be small. Degradation of the gate oxide film and increases in leakage current may also be prevented.

30 Claims, 8 Drawing Sheets

METHOD OF FORMING TRANSISTOR HAVING RECESS CHANNEL IN SEMICONDUCTOR MEMORY, AND STRUCTURE THEREOF

CROSS REFERENCE TO RELATED APPLICATIONS

This application claims priority from Korean Patent Application No. 2003-39164, filed on 17 Jun. 2003, the contents of which are incorporated by reference in their entirety.

BACKGROUND OF THE INVENTION

1. Technical Field of the Invention

This disclosure relates to transistor manufacturing for a semiconductor memory, and more particularly, to a transistor having a recess channel and a method for forming the same.

2. Description of the Related Art

A MOS transistor is generally constructed of gate, drain and source regions. A gradually increasing integration density in semiconductor devices requires the continued miniaturization of transistors, but there is a limitation in that a junction depth of a source and drain region can't become exceedingly shallow. That is, the gradual reduction of the length of channel causes the depletion region of the source and drain to invade the interior of channel, reducing the effective length of the channel along with the threshold voltage. A short channel effect is thus generated, and gate control function in the MOS transistor is lost. The shortened channel length causes a high electric field in the semiconductor device, which generates a hot carrier. The hot carrier brings about collision ionization and the hot carrier thus invades an oxide film. The oxide film is thus degraded.

In order to prevent these short channel effects, a thickness of a gate insulation film should be reduced, and a channel between the source and drain, namely, a maximum width of the depletion region provided under the gate should be reduced, and a density of dopant in the semiconductor substrate should be reduced.

In order to prevent the short channel effect, conventional methods have attempted to ion implant a dopant of opposite conductivity type into a lower part of the channel region, together with the shallow junction. Furthermore, in order to prevent the hot carrier effect, most conventional transistor manufacturing processes employ a lightly doped drain (LDD) structure, which forms a buffering region of a low density implantation between the gate region and the drain region, which have a high density implantation. However, since the channel length is continuously shortened by tendency to increase the integration density of the semiconductor device, the transistor of the LDD structure has the short channel and hot carrier phenomena, too. Furthermore, the dopants in the source and drain regions are diffused to a side thereof, by a punchthrough effect, during operation of the transistor.

In order to solve these problems, a transistor structure has been proposed that has a gate formed in a recess channel that is formed in the semiconductor substrate. The recess is formed in a region where a channel of the transistor would be formed, increasing an effective channel length and improving the punchthrough resistance of the source and drain regions. The recess actually widens a distance between the source and the drain, enhancing a high-integration density of the semiconductor device.

FIGS. 1 to 7 are cross-sectional views illustrating a sequential manufacturing process for a transistor having a recess channel according to the conventional art.

Figure 1:
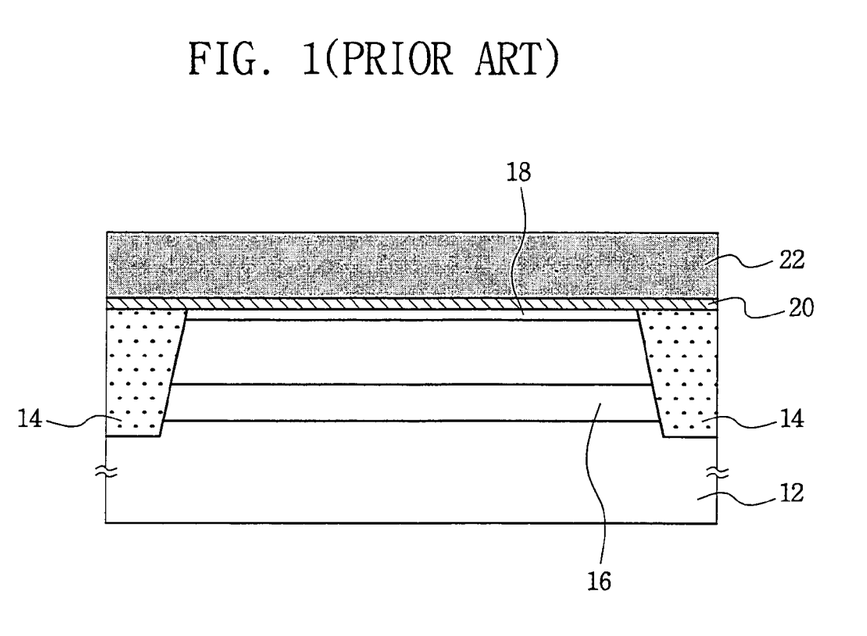
FIGS. 1 to 7 are cross-sectional diagrams illustrating a sequential manufacturing process for a transistor having a recess channel according to the conventional art.

With reference to FIG. 1, a low density doping layer 18 is formed through an ion implantation on a semiconductor substrate 12 on which a device separation film 14 is formed, and a channel adjusting dopant layer 16 is formed to prevent punchthrough. On the semiconductor substrate 12 on which the low density doping layer 18 and the channel adjusting dopant layer 16 were formed, an oxide film 20 and a mask film 22 are formed.

Figure 2:
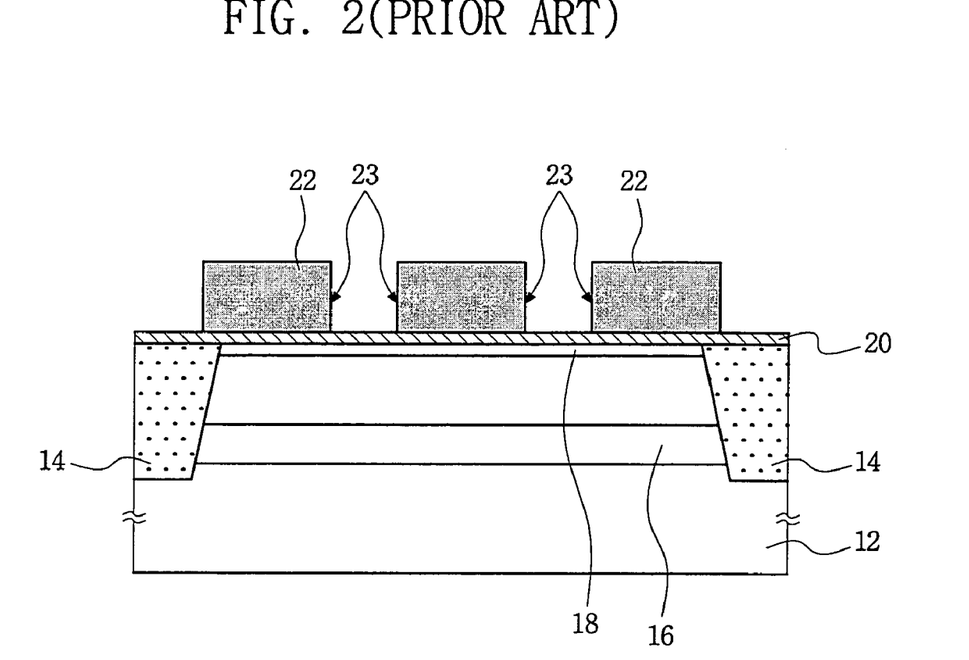

In FIG. 2, an opening 23 having a predetermined pattern is formed in the mask film 22.

An open critical dimension (CD) in an upper part of the opening 23 is about 90 nm, and a CD in a lower part of the opening 23 is about 50 nm.

Figure 3:
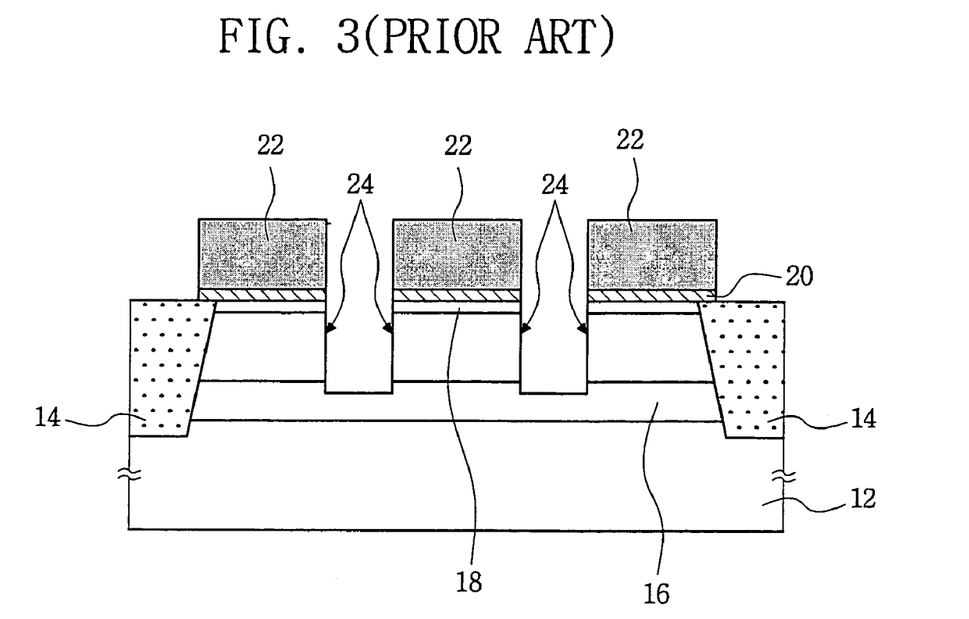

In FIG. 3, the semiconductor substrate 12 and the oxide film 20 exposed in the lower part of the opening 23 are etched by using the mask film 22 as an etch mask, to thus form a recess 24.

A process of forming the recess 24 includes a breakthrough (BT) process of removing the oxide film 20 and a process of forming the recess 24.

Figure 4:
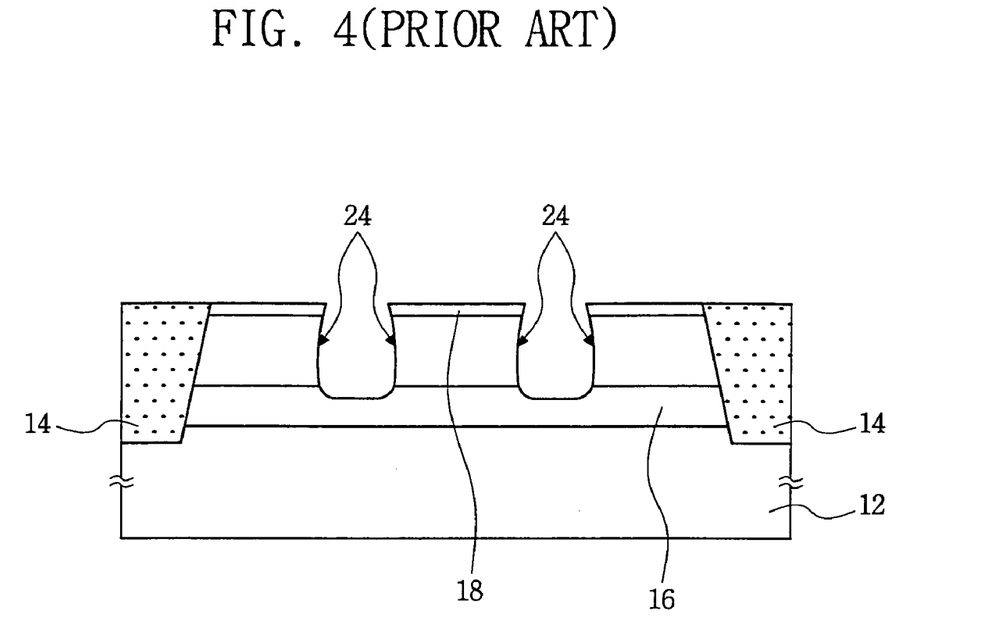

FIG. 4 illustrates the semiconductor substrate 12 having the recess 24 formed after a chemical dry etching (CDE) process is performed to remove the mask film 22.

The recess 24 has a generally large open CD and the upper edge of the recess 24 is formed as a pointed shape.

Figure 5:
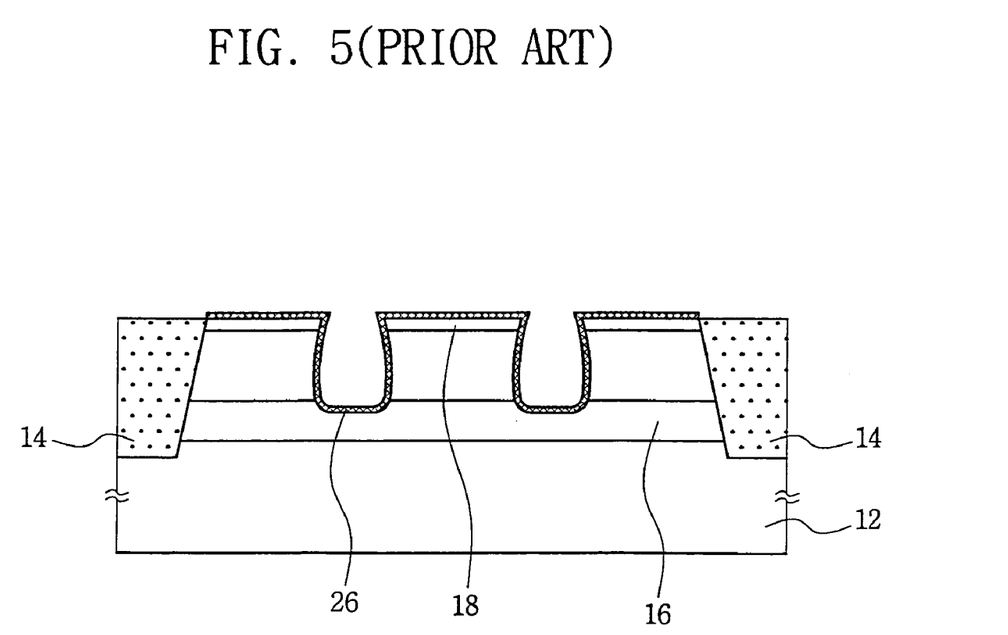

In FIG. 5, the oxide film 20 remaining on the semiconductor substrate 12 is removed and this is passed through a thermal oxide process, then a gate oxide film 26 is formed on an overall face of the semiconductor substrate 12 including the recess 24.

Figure 6:
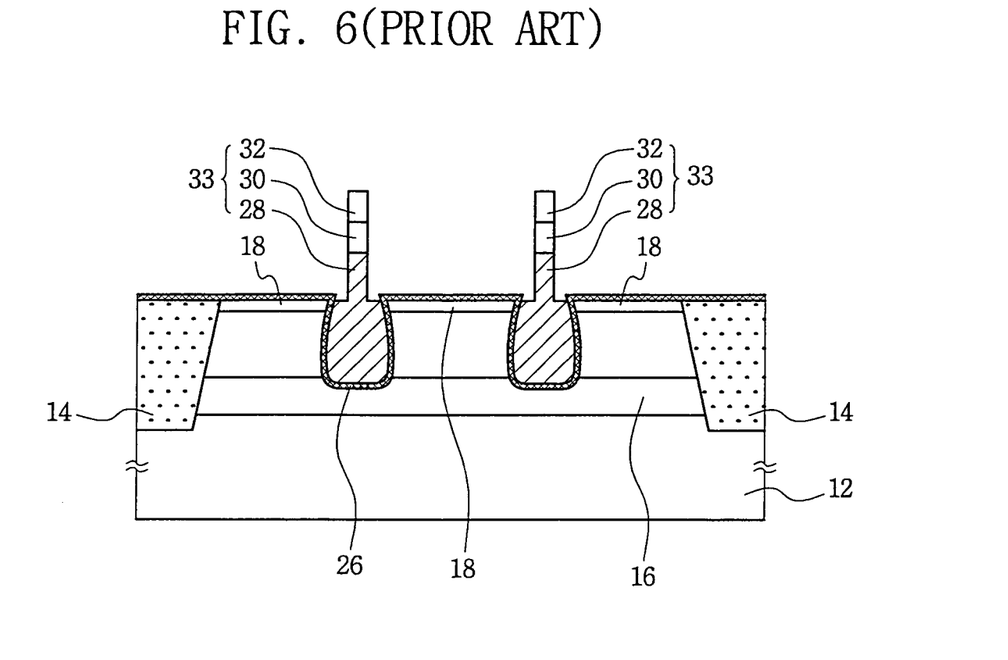

In FIG. 6, a gate stack 33 containing a gate electrode 28 formed of polysilicon, a metal silicide layer 30, and a gate insulation film 32, is formed on the semiconductor substrate 12 having the gate oxide film 26.

The CD of the gate stack 33 is about 60 nm, smaller than the upper open CD of the recess, to be entered inside the recess 24.

Figure 7:
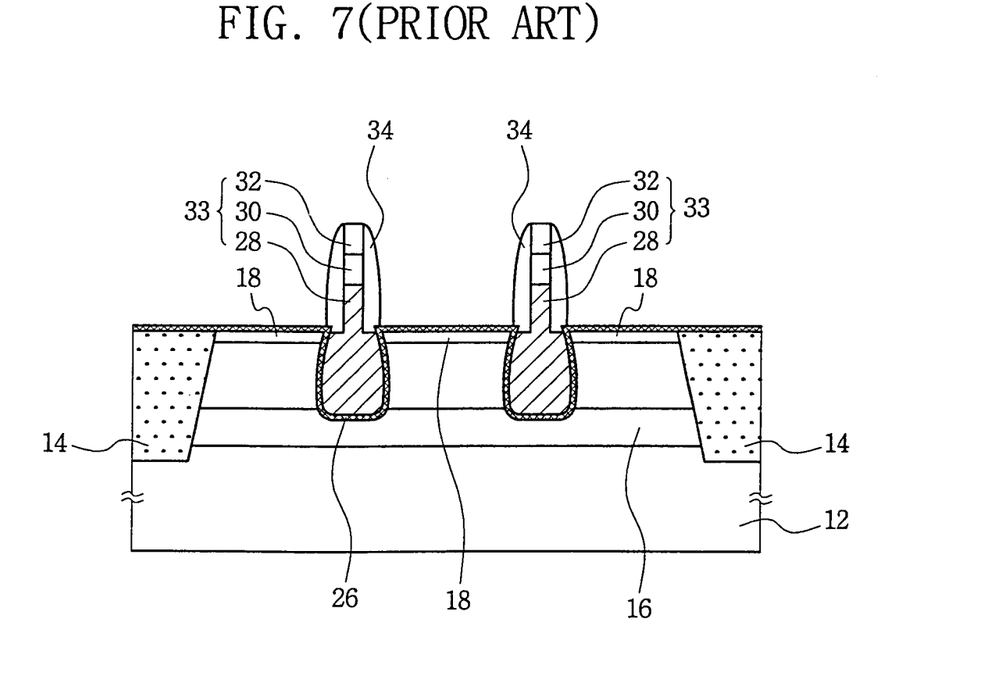

In FIG. 7, gate spacers 34 are formed on either side of the gate stacks 33.

Source and drain regions are formed by implanting a high-density doping ion into the semiconductor substrate 12 having the gate spacer. A series of these processes completes the conventional transistor having the recess channel.

This method of forming the transistor according to the conventional art exhibits the following problems.

First, since the recess has a structure where an open CD of the recess 24 is greater than a CD of a gate stack 33, polysilicon on the sides of the gate electrode collapses toward an interior lower side of the recess 24 during a necessary etching process for forming the gate stack. According to conventional methods, there is difficulty in controlling the level of collapse. Furthermore, if a deposited thickness of the gate electrode is thin, an aspect ratio becomes large, and reducing a process margin and other issues concerning a profile become problematic.

Secondly, when the upper CD of the recess is large, there is a problem that a bottom CD of a self aligned contact (SAC) that is formed as a bitline contact or a storage node contact in a subsequent process should be formed relatively small.

Thirdly, in etching a polysilicon used as material for use of the mask in order to form an etch mask pattern on a semiconductor substrate, the surface of the oxide film is not uniform because the oxide film exposed in the lower part is also partially etched. Thus, a difference in an etching depth is caused in the BT process as the process of etching the oxide film among processes of forming the recess. This causes a difference from a depth of the recess.

Fourthly, in forming the gate oxide film on the semiconductor substrate, an upper part of the recess is formed as a pointed shape, thus causing a thinned effect of the gate oxide film and a concentrated phenomenon of electric field onto an edge portion of the upper part of the recess. Furthermore, a leakage current increases and a degradation of the gate oxide film may occur.

Embodiments of the invention address these and other disadvantages of the conventional art.

SUMMARY OF THE INVENTION

Some embodiments of the invention provide a method of forming a transistor having a recess channel and a structure thereof, in which an open CD of a recess is formed small to prevent a side face of a gate electrode from collapsing in forming the gate electrode and to small form an aspect ratio of the gate electrode, thus provide a process margin largely and improve problems concerning a profile, caused due to a large open CD of the recess.

Some embodiments provide a method of forming a transistor having a recess channel and a structure thereof, which is capable of improving a small bottom CD of a SAC, etc. Some embodiments of the invention also provide a method of forming a transistor having a recess channel and a structure thereof, which is capable of preventing a difference in the recess channel depth and of forming the recess uniformly.

Further embodiments of the invention provide a method of forming a transistor having a recess channel and a structure thereof, an upper edge of the recess being formed with a rounded shape to prevent a gate oxide film from being thinned and the upper edge of the recess from being concentrated by an electric field, thus preventing an increase of leakage current and a degradation of the gate oxide film.

BRIEF DESCRIPTION OF THE DRAWINGS

The above and other features of the invention will become readily apparent from the description of the exemplary embodiments that follows, with reference to the attached drawing.

DETAILED DESCRIPTION OF THE INVENTION

According to some embodiments of the invention, a method of forming a transistor having a recess channel and a structure thereof will be described with reference to FIGS. 8 to 15. It will be understood by those skilled in the art that the invention may be practiced in numerous different ways and is not limited to the following described embodiments. Rather, the embodiments described below are exemplary in nature.

FIGS. 8 to 15 are cross-sectional diagrams illustrating a sequential manufacturing process for a transistor having a recess channel according to some embodiments of the invention, and the resulting structure.

Figure 8:
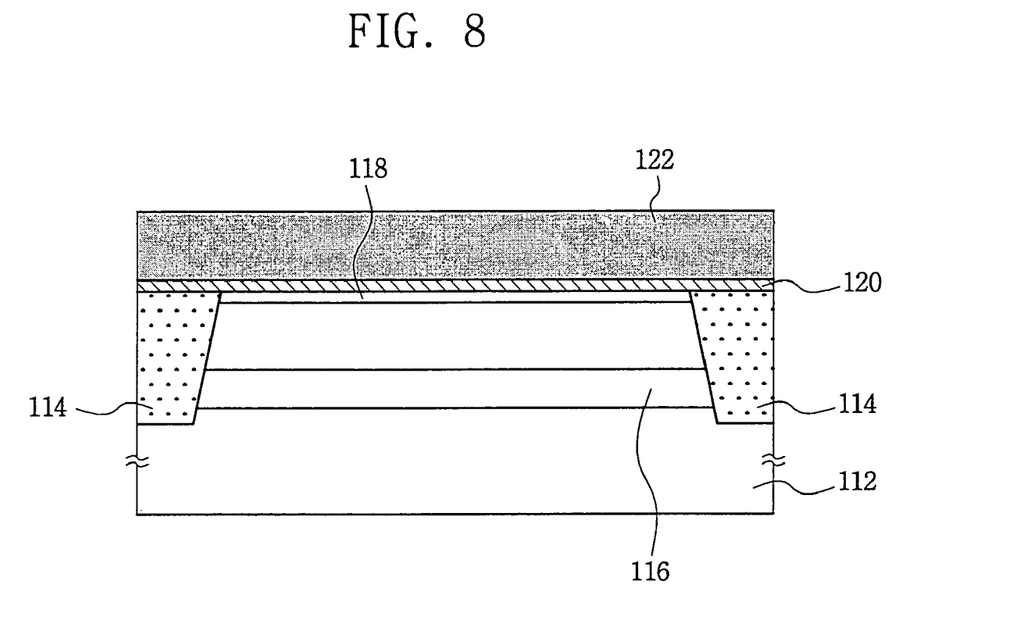
FIGS. 8 to 15 are cross-sectional diagrams illustrating a sequential manufacturing process for a transistor having a recess channel according to some embodiments of the invention.

Referring to FIG. 8, a low density doping layer 118 is formed through an ion implantation on a semiconductor substrate 112 on which a device separation film 114 was formed, and a channel adjusting dopant layer 116 is formed to prevent punchthrough. On the semiconductor substrate 112 on which the low density doping layer 118 and the channel adjusting dopant layer 116 were formed, a pad oxide film 120 and a mask film 122 are formed.

The low density doping layer 118 is formed near the surface of the semiconductor substrate 112. The channel adjusting dopant layer 116 is formed to prevent a short channel effect, and is formed by doping with a dopant having conductivity opposite to the dopant of the low density doping layer 118.

The pad oxide film 120 may be desirably formed of a medium temperature oxide (MTO) film, and its thickness is about 100 Å. The mask film 122 may be desirably formed of polysilicon, and its thickness has about 1000 Å.

Figure 9:
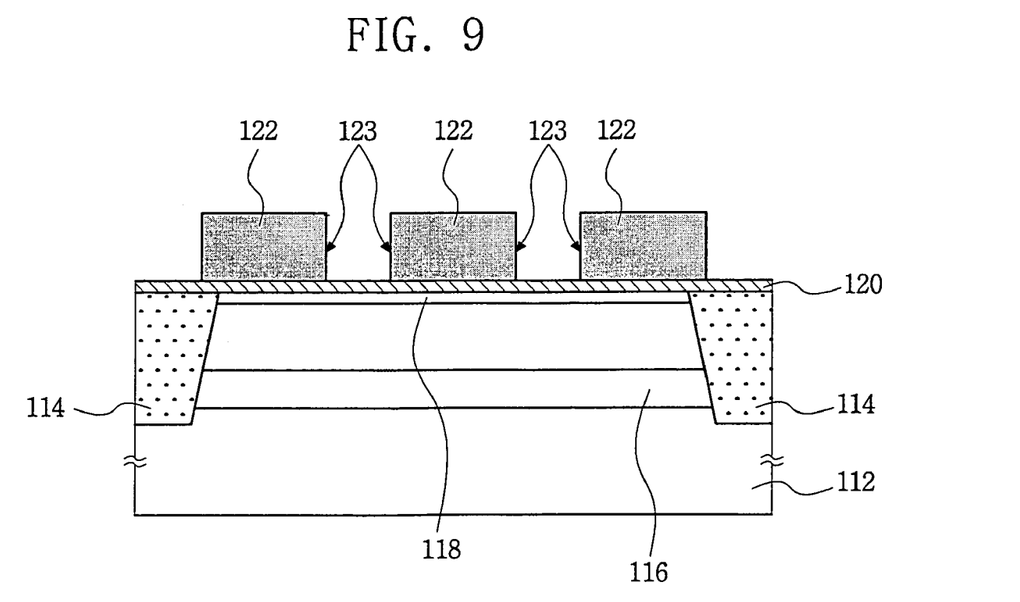

With reference to FIG. 9, a mask pattern in which an opening 123 having a predetermined pattern is formed by etching the mask film 122.

The opening 123 is formed to expose the pad oxide film 120, and the pad oxide film 120 serves as an etch stop film. An open CD of the opening 123 is about 50 nm to 100 nm.

Figure 10:
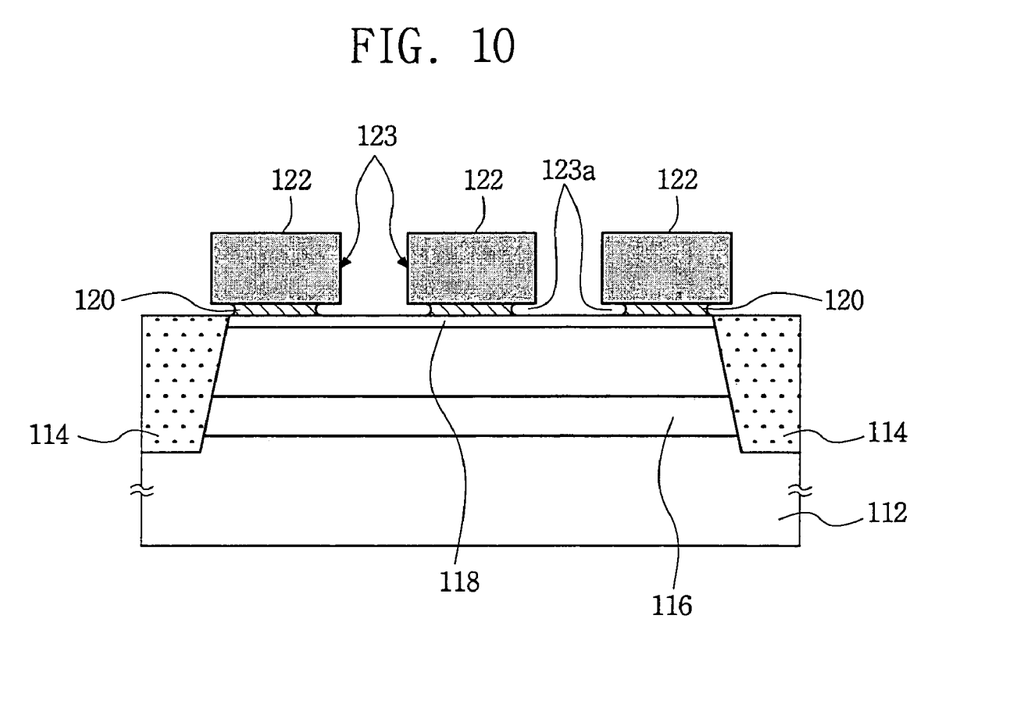

Referring to FIG. 10, an undercut region 123a is formed by selectively etching the pad oxide film 120 exposed in the opening 123. The undercut region is formed in such a way that the pad oxide film 120 provided underneath the mask film is partially removed. The etching of the pad oxide film 120 is performed through a wet etching method as an isotropic etching method. The undercut region 123a preferably undercuts the edges of the mask film by about 100 Å.

The pad oxide film 120 is removed through the wet etching method, thus the pad oxide film removal process can be omitted from the recess forming process described below in order to prevent a nonuniformity of the recess depth caused by the pad oxide film removal process.

Figure 11:
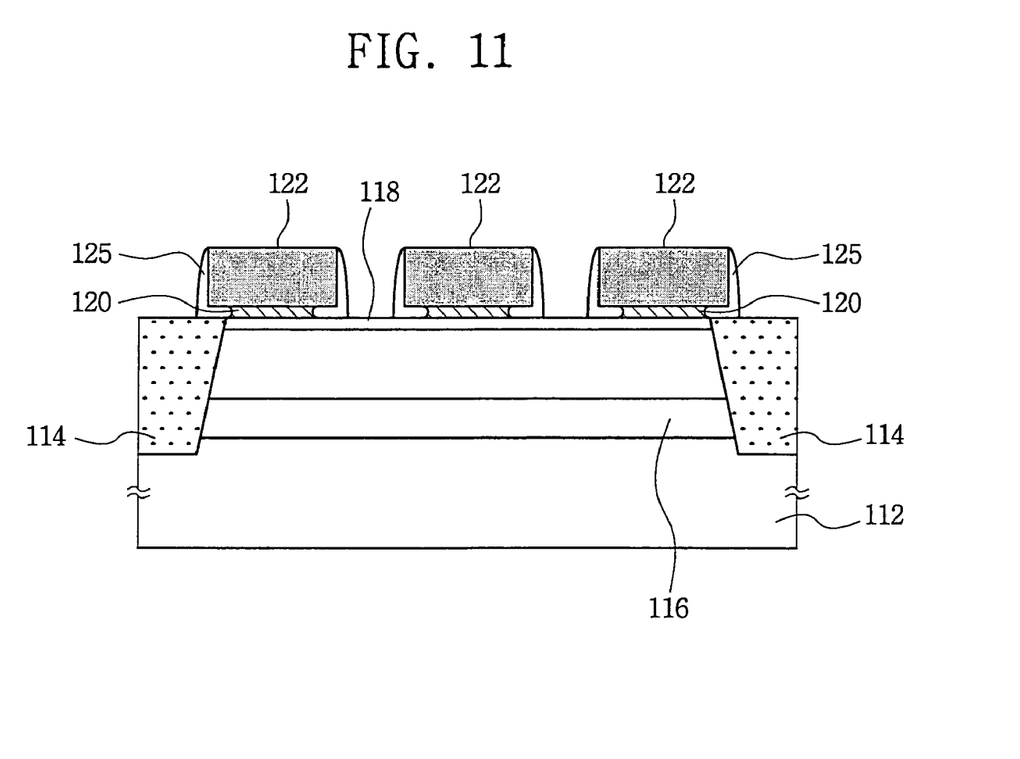

In FIG. 11, a sidewall spacer 125 is formed in the mask film 122 involving the undercut region 123a, in which the opening 123 was formed.

The sidewall spacer 125 is formed by depositing polysilicon to a thickness of about 200 Å. Furthermore, the polysilicon of the sidewall spacer 125 completely fills the undercut region 123a formed in the pad oxide film 120.

The process of forming the sidewall spacer 125 includes forming a material film for use as a sidewall spacer on the semiconductor substrate including the undercut region, then anisotropically etching the sidewall spacer material film. The anisotropic etching is preferably performed by a reactive ion etching method or a plasma etching method.

Figure 12:
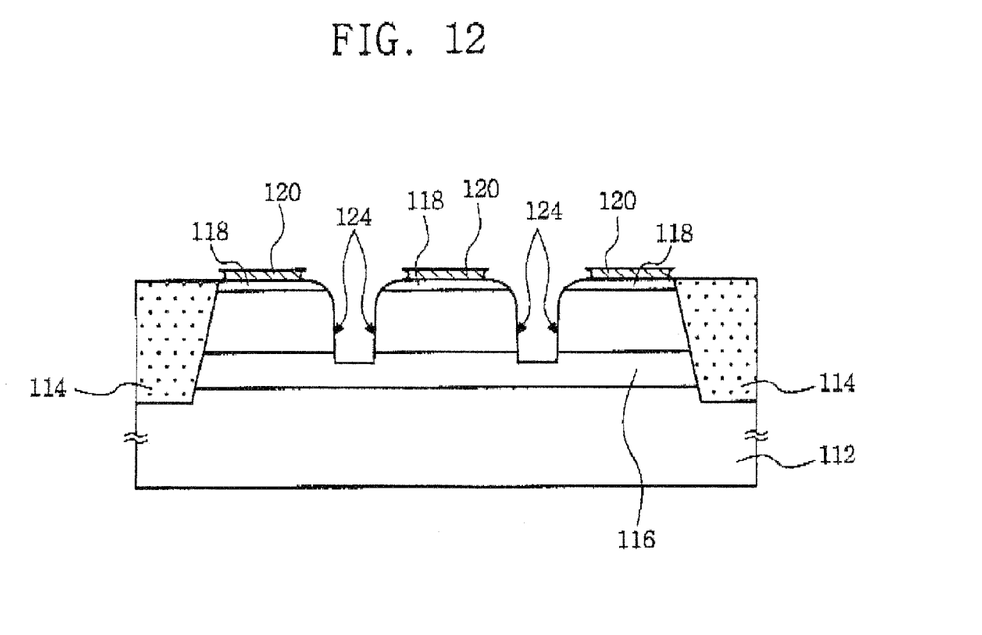

In FIG. 12, a recess 124 is formed by etching the semiconductor substrate 112 using the sidewall spacer 125 and the mask film 122 as a mask.

When the recess 124 is formed, the sidewall spacer 125 and the mask film 122 are etched at the same time. Thus, differently from the prior art, a BT process of etching the oxide film 120 is omitted. Consequently, a non-uniformity of the recess depth is prevented by the etching process of the oxide film 120, to uniformly form the depth of the recess 124. Furthermore, since the sidewall spacer 125 is used as an etching mask to form the recess 124, an open CD of the recess 124 is minimized.

A tint of the sidewall spacer 125, and the undercut region 123a formed by wet-etching the pad oxide film 120, resulting in a convexly rounded edge portion of the upper part of the recess 124. A depth of the recess 124 is preferably about 1000 Å to 1500 Å.

Figure 13:
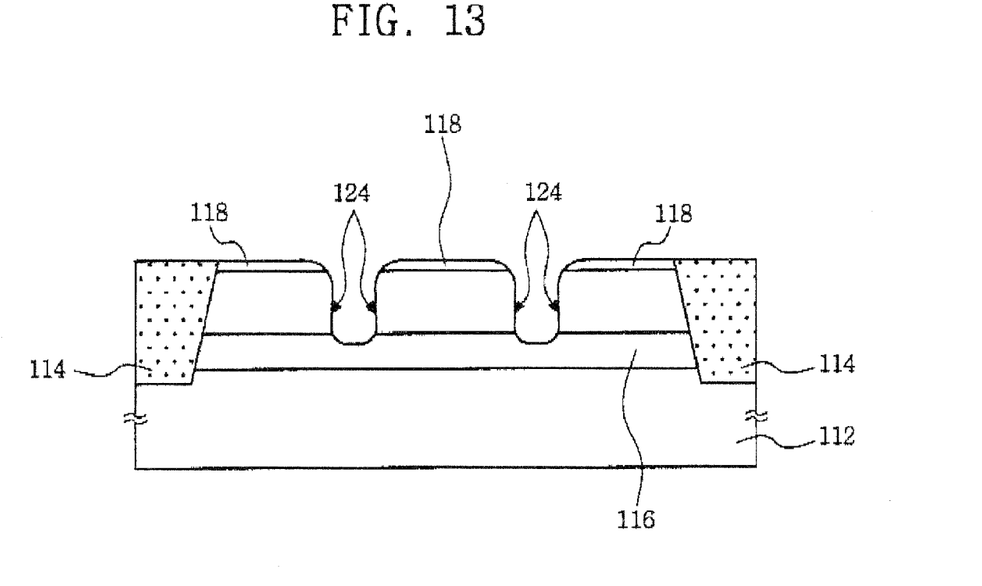

FIG. 13 shows the resulting structure on the semiconductor substrate 112 after removing the pad oxide film 120.

In alternative embodiments of the invention, an isotropic etching process is additionally performed before removing the pad oxide film 120. To additionally perform the isotropic etching process is to remove an unetched portion of the recess 124 and to roundly form an interior shape of the recess 124.

The isotropic etching employs a CDE method. After the CDE process, the pad oxide film 120 remaining on the semiconductor substrate 112 is removed. An open CD of the upper part of the recess is about 65 nm.

Since the semiconductor substrate 112 is damaged by the etching process used to form the recess 124, a thermal oxide process may be additionally formed to remove the damage. Also, a process for removing the oxide film generated by the thermal oxide process may be performed.

Forming a channel adjusting dopant doping region in a lower part of the recess 124 may also be added to prevent punchthrough.

Figure 14:
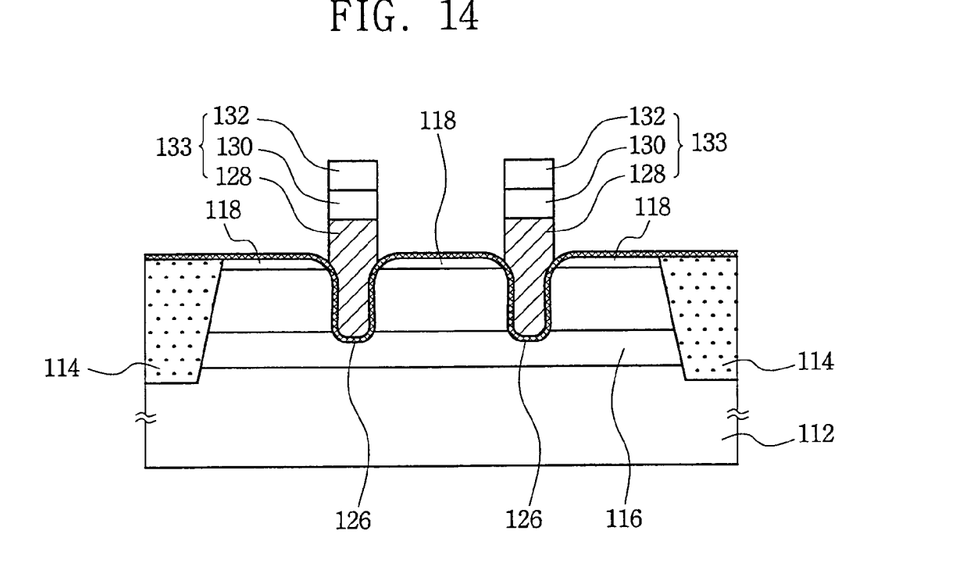

In FIG. 14, a gate oxide film 126 is formed on the semiconductor substrate 112 having the recess 124, and a gate stack 133 involving a gate electrode 128, a metal silicide film 130, and a gate insulation film 132 is formed on an upper part of the recess 124 on which the gate oxide film 126 was formed.

The gate stack 133 is formed by sequentially depositing a gate electrode material, a metal silicide material, and a gate insulation material on the semiconductor substrate 112 having the recess 124 and by performing a photolithography and etching process.

The gate electrode 128 is formed by depositing polysilicon, and the metal silicide film 130 can be formed additionally thereto in order to reduce a contact resistance. The metal silicide film 130 can be formed of $WSi_x$, $TaSi_2$, or $MoSi_2$.

The gate insulation film can be formed of a silicon oxide film, a silicon nitride film SiN, or a silicon oxynitride film SiON, etc. The gate electrode 128 is formed in the interior of the recess 124, and is overlapped with the roundly formed edge portion of the upper part of the recess 124, which is higher than the semiconductor substrate. A CD of the gate electrode 128 is about 60 nm.

A low density doping layer may also be added onto the semiconductor substrate having the gate stack.

Figure 15:
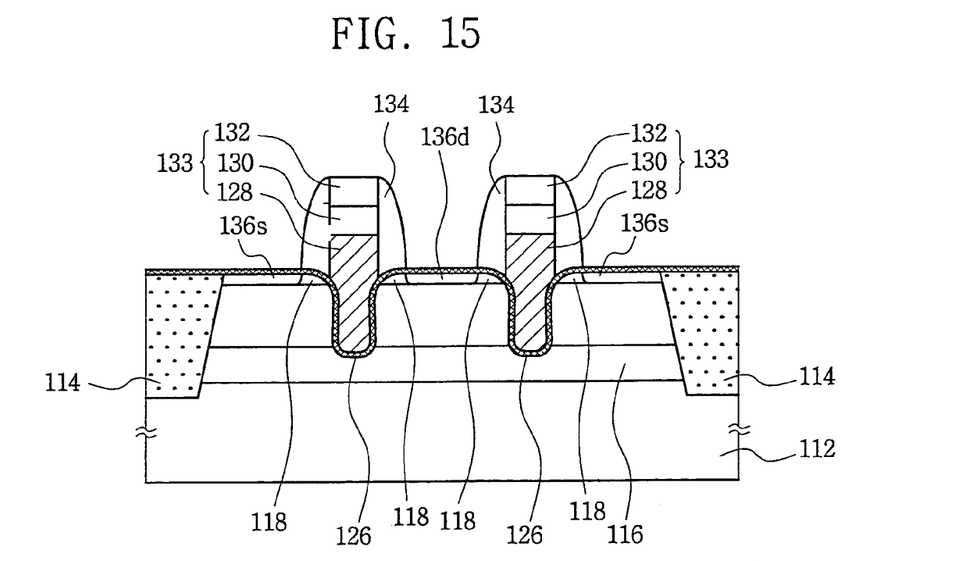

In FIG. 15, a gate spacer 134 is formed on the semiconductor substrate having the gate stack 133.

The gate spacer 134 can be desirably formed of a silicon oxide film, or a family of a silicon nitride film SiN or silicon oxynitride film SiON, etc.

On the semiconductor substrate having the gate stack 133 and the gate spacer 134, a source region 136s and a drain region 136d doped by a high density are formed, to thus form a transistor having a recess channel. A method of forming the a source region 136s and the drain region 136d doped by the high density employs an ion implantation method.

The inventive method of forming the transistor having the recess channel type gate, and the structure thereof, are applicable not only to an NMOS (N-type Metal Oxide Semiconductor) transistor, but also to a PMOS (P-type Metal Oxide Semiconductor) transistor, and also applicable to others such as a CMOSFET (Complementary Metal Oxide Semiconductor Field Effect Transistor).

As described above, a transistor having a recess channel has the following advantages as compared with the conventional art, for example.

Differently from the method of forming a transistor having a recess channel according to the conventional art, embodiments of the invention form a small open CD of the recess through an etching process using a sidewall spacer. Thus, a collapse phenomenon of a gate electrode does not occur in an etching process of forming a gate stack. In addition, the problems of a relatively large aspect ratio of the gate electrode or a relatively large open CD of the recess can be solved. Thus, process margins can become larger.

Also, a transistor having a recess channel formed by embodiments of the invention can solve a problem where a bottom CD becomes small in a self aligned contact (SAC) formation since the open CD of the recess is formed small.

Further in the process of forming the recess according to embodiments of the invention, an oxide film is removed previously through a wet etching method, differently from a recess forming procedure of the prior art, thus a BT process can be omitted in the recess forming process. Thus, the problem of different depth recesses do not occur in the recess forming procedure, and the recesses may be formed uniformly.

Additionally, in forming the recess to form a gate electrode according to embodiments of the invention, since an upper edge portion thereof is formed roundly and convexly, a thinned phenomenon of a gate oxide film is prevented and an electric field concentrated phenomenon onto the upper edge portion of the recess can be prevented, and an increase of leakage current and a degradation of the gate oxide film can be prevented.

The invention may be practiced in many ways. What follows are exemplary, non-limiting descriptions of some embodiments of the invention.

According to some embodiments of the invention, a method of forming a transistor having a recess channel includes sequentially forming a pad oxide film and a mask film on a semiconductor substrate having a device separation film, and then forming an opening for partially exposing the pad oxide film by performing a photolithography and etching process on the mask film. Next, forming an undercut region using an etching process is performed by using the mask film as an etch mask, to simultaneously etch the pad oxide film exposed in the opening and the pad oxide film provided in an edge lower part of the mask film, thus exposing a partial surface of the semiconductor substrate that extends under an edge of the lower part of the mask film to form the undercut region. Subsequently, a sidewall spacer is formed that extends from the undercut region and that surrounds both sidewalls of the mask film, and an etching process using the mask film as the etch mask is performed to form a recess in the semiconductor substrate. Subsequently, a gate oxide film is formed on the semiconductor substrate inside the recess, then a gate electrode is formed in the recess over the gate oxide film. The gate electrode overlaps with an upper edge portion of the recess and is positioned higher than an upper part of the recess. Next, a gate insulation film is formed on the gate electrode. Then, a gate spacer is formed on the semiconductor substrate where the gate electrode and the gate insulation film were formed. Finally, a source region and a drain region doped with a high density dopant are formed.

The method may further include forming a low density doping layer on the semiconductor substrate, and preferably further includes forming a channel adjusting dopant doping region for preventing a punchthrough in a lower part of the recess. The method can further include performing a thermal oxide process after the etching process of the semiconductor substrate to form the recess, and may further include removing a silicon oxide film formed through the thermal oxide process.

In performing the etching process to form the recess, the mask film used as the etch mask and the sidewall spacer can be etched simultaneously. After forming the recess, an isotropic etching process using a CDE method may be further performed in the recess interior to form the transistor that has a recessed channel. The etching process using the CDE method is performed desirably in a range from 100 Å to 200 Å. The gate electrode is formed, further including a metal silicide film.

According to other embodiments of the invention, a structure of a transistor having a recess channel includes a semiconductor substrate having a recess, an edge portion of the upper part of the recess being rounded convexly, a corner portion of the interior of the recess being rounded concavely. This structure also includes a gate oxide film formed on an inner face of the recess, and a gate electrode that overlaps with the rounded edge portion of the upper part of the recess. The gate electrode is formed higher than the semiconductor substrate, and is also formed being buried into the interior of the recess on the gate oxide film.

It will be apparent to those skilled in the art that modifications and variations can be made in the present invention without deviating from the spirit or scope of the invention. Thus, it is intended that the present invention cover any such modifications and variations of this invention provided they come within the scope of the appended claims and their equivalents. For instance, a shape of a gate stack, a shape of a recess, or a configuration of film material, etc. can be changed through a transistor forming procedure, or steps in a manufacturing process can be added or omitted. Accordingly, these and other changes and modifications are seen to be within the true spirit and scope of the invention as defined by the appended claims.

I claim:

1. A method of forming a transistor having a recess channel, said method comprising:
    sequentially forming a pad oxide film and a mask film on a semiconductor substrate having a device separation film, and then forming an opening for partially exposing the pad oxide film by performing a photolithography and etching process;
    simultaneously etching the pad oxide film exposed in the opening and the pad oxide film provided at a lower edge of the mask Film to expose a partial surface of the semiconductor substrate in an undercut region of the mask film;
    performing an etching process to form a recess in the semiconductor substrate by using the mask film as an etch mask and to simultaneously form a sidewall spacer that extends from the undercut region and that surrounds both sidewalls of the mask film;
    forming a gate oxide film on the semiconductor substrate including a surface of the recess, then forming a gate electrode inside the recess that overlaps an upper edge of the recess and is positioned higher than an upper part of the recess, then forming a gate insulation film on the gate electrode; and
    forming a gate spacer on a sidewall of the gate electrode and the gate insulation film, and forming a source region and a drain region.

2. The method of claim 1, further comprising removing the pad oxide film after forming the recess.

3. The method of claim 1, further comprising forming a low density doping layer on the semiconductor substrate.

4. The method of claim 3, further comprising forming the low density doping layer on the semiconductor substrate before forming the gate spacer.

5. The method of claim 1, further comprising forming a channel adjusting dopant doping region.

6. The method of claim 5, further comprising forming the channel adjusting dopant doping region in a lower part of the recess.

7. The method of claim 1, wherein forming the pad oxide film comprises forming a medium temperature oxide (MTO) film.

8. The method of claim 7, wherein forming the mask film comprises forming a polysilicon film.

9. The method of claim 1, wherein etching the pad oxide film comprises etching with an isotropic etching method.

10. The method of claim 9, wherein etching with an isotropic etching method comprises performing a wet etching method.

11. The method of claim 1, wherein forming the sidewall spacer further comprises forming a sidewall spacer material film on the semiconductor substrate and anisotropically etching the sidewall spacer material film.

12. The method of claim 11, wherein anisotropically etching the sidewall spacer film material comprises employing a reactive ion etching method or a plasma etching method.

13. The method of claim 11, wherein forming the sidewall spacer material film comprises forming a polysilicon material film.

14. The method of claim 1, further comprising performing a thermal oxide process after performing the etching process to form the recess.

15. The method of claim 14, further comprising removing a silicon oxide film formed by performing the thermal oxide process.

16. The method of claim 1, further comprising isotropically etching the semiconductor substrate after performing the etching process to form the recess.

17. The method of claim 16, wherein isotropically etching comprises employing a chemical dry etching (CDE) method.

18. The method of claim 17, wherein isotroprically etching further comprises etching to a range of about 100 Å to about 200 Å.

19. The method of claim 1, wherein forming the gate electrode comprises forming the gate electrode of amorphous silicon or polysilicon material.

20. The method of claim 19, wherein forming the gate electrode further comprises forming a metal suicide film.

21. The method of claim 20, wherein forming the metal silicide film comprises forming a film chosen from the group consisting of $WSi_x$, $TaSi_2$, and $MoSi_2$.

22. The method of claim 14, wherein forming the drain region and the source region comprises forming a high density drain region and a high density source region through an ion implantation method.

23. The method as claimed in 22, further comprising performing the thermal oxide process after forming the high density drain region and the high density source region.

24. A method of manufacturing a semiconductor transistor, comprising:
    photolithographically etching a mask film to form a mask pattern that partially exposes a pad oxide layer that is disposed in contact with an upper surface of a semiconductor substrate;
    isotropically etching the pad oxide layer to expose a first portion and a second portion of the upper surface of the semiconductor substrate, the second portion including an undercut region disposed directly beneath the mask pattern;

forming a spacer to cover the second portion of the upper surface of the semiconductor substrate, the spacer abutting a sidewall of the mask pattern and a sidewall of the pad oxide layer;

etching the semiconductor substrate using the spacer as a mask to form a recess in the semiconductor substrate;

forming a gate insulation film in contact with a sidewall of the recess; and forming a gate electrode that fills the recess and overlaps an upper edge of the recess.

25. The method of claim 24, wherein etching the semiconductor substrate to form a recess comprises etching the semiconductor substrate such that an upper corner of the recess is convex and a lower corner of the recess is concave.

26. The method of claim 1, wherein an upper width of the gate electrode is substantially equal to a width of an upper opening of the recess.

27. A method of forming a semiconductor device, the method comprising:

forming a separation pattern on a semiconductor substrate;

sequentially forming a pad oxide film and a mask film on the semiconductor substrate having the device separation pattern;

forming a plurality of openings for partially exposing the pad oxide film by performing a photolithography and etching process;

etching the pad oxide film exposed in the plurality of openings to expose a partial surface of the semiconductor substrate in a plurality of undercut regions of the mask film;

forming a plurality of sidewall spacers that extend from the plurality of undercut regions and that surround the sidewalls of the mask film;

performing an etching process to form a plurality of recesses in the semiconductor substrate by using the mask film and the plurality of sidewall spacers as an etch mask;

forming a gate oxide film on the semiconductor substrate including surfaces of the plurality of recesses;

forming a plurality of gate electrodes inside the recesses that overlap a plurality of upper edges of the recesses, wherein the plurality of gate electrodes are positioned higher than an upper part of the recesses;

forming a plurality of gate insulation films on the plurality of gate electrodes; and forming a plurality of gate spacers disposed on the sidewalls of the plurality of gate electrodes and the plurality of gate insulation films.

28. The method of claim 27, wherein forming the plurality of sidewall spacers further comprises forming a sidewall spacer material film on the semiconductor substrate and anisotropically etching the sidewall spacer material film.

29. The method of claim 28, wherein performing the etching process to form the plurality of recesses and forming the plurality of sidewall spacers occur simultaneously.

30. The method of claim 29, wherein the plurality of recesses in the semiconductor substrate have a substantially uniform depth.

* * * * *

UNITED STATES PATENT AND TRADEMARK OFFICE
CERTIFICATE OF CORRECTION

PATENT NO. : 7,163,865 B2
APPLICATION NO. : 10/867845
DATED : January 16, 2007
INVENTOR(S) : Ji-Young Kim It is certified that error appears in the above-identified patent and that said Letters Patent is hereby corrected as shown below:

Column 7, line 49, the word "Film" should read -- film --;
Column 8, line 49, the word "suicide" should read -- silicide --.

Signed and Sealed this

Second Day of September, 2008

JON W. DUDAS
*Director of the United States Patent and Trademark Office*